(12) United States Patent
Asai et al.

(10) Patent No.: US 12,334,809 B2
(45) Date of Patent: Jun. 17, 2025

(54) POWER SUPPLY SHUT-OFF CONTROL DEVICE

(71) Applicant: Mitsubishi Electric Corporation, Tokyo (JP)

(72) Inventors: Toshiki Asai, Tokyo (JP); Akihiro Tsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 321 days.

(21) Appl. No.: 18/245,428

(22) PCT Filed: Nov. 18, 2020

(86) PCT No.: PCT/JP2020/043035
§ 371 (c)(1),
(2) Date: Mar. 15, 2023

(87) PCT Pub. No.: WO2022/107252
PCT Pub. Date: May 27, 2022

(65) Prior Publication Data
US 2023/0353038 A1    Nov. 2, 2023

(51) Int. Cl.
*H02M 1/32* (2007.01)
*H02M 1/00* (2006.01)
(Continued)

(52) U.S. Cl.
CPC ............ *H02M 1/08* (2013.01); *H02M 1/0009* (2021.05); *H02M 1/32* (2013.01); *H02M 1/325* (2021.05);
(Continued)

(58) Field of Classification Search
CPC ........ H02M 1/0009; H02M 1/08; H02M 1/32; H02M 1/325; H02M 1/327; H02M 7/537;
(Continued)

(56) References Cited

U.S. PATENT DOCUMENTS

2006/0126246 A1\* 6/2006 Hussein ............... H10D 84/854
                                                          361/91.1
2019/0280616 A1\* 9/2019 Tanabe ................ H02M 7/5387
(Continued)

FOREIGN PATENT DOCUMENTS

JP    2004-304924 A    10/2004
JP    2014-147210 A     8/2014
(Continued)

OTHER PUBLICATIONS

International Search Report dated Jan. 19, 2021, issued in corresponding International Patent Application No. PCT/JP2020/043035 (and English Machine Translation).

*Primary Examiner* — Jue Zhang
*Assistant Examiner* — Jye-June Lee
(74) *Attorney, Agent, or Firm* — Posz Law Group, PLC

(57) ABSTRACT

A power supply control device includes: a power conversion device; a controller; a current detection device; a comparison device configured to output a shut-off start signal when a value of current detected by the current detection device is larger than a preset current threshold value; a shut-off device configured to shut off, based on a shut-off control signal, a conversion operation signal; a latch device configured to output the shut-off control signal based on the shut-off start signal output by the comparison device and to perform, until a latch release signal is input, a latch operation, in which the shut-off device is caused to maintain a state in which a conversion operation signal is shut off; and a delay device configured to output a latch release signal after a delay time elapses, the delay time being determined by components of the delay device.

14 Claims, 14 Drawing Sheets

(51) Int. Cl.
  *H02M 1/08*     (2006.01)
  *H02M 7/537*    (2006.01)
  *H02M 7/5387*   (2007.01)
  *H03K 17/14*    (2006.01)
  *H03K 17/0812*  (2006.01)

(52) U.S. Cl.
  CPC ........... *H02M 1/327* (2021.05); *H02M 7/537* (2013.01); *H02M 7/53871* (2013.01); *H03K 17/145* (2013.01); *H03K 17/0812* (2013.01)

(58) Field of Classification Search
  CPC ............ H02M 7/53871; H03K 17/145; H03K 17/0812
  See application file for complete search history.

(56)          References Cited

U.S. PATENT DOCUMENTS

2019/0326898 A1    10/2019  Taguchi
2020/0153230 A1*   5/2020   Atluri ................... H02H 3/066

FOREIGN PATENT DOCUMENTS

JP     2019-193410 A    10/2019
WO     2008/132975 A1   11/2008

* cited by examiner

FIG. 3

| INPUT | CONTROL TERMINAL 7a | CONTROL TERMINAL 7b | OUTPUT |
|---|---|---|---|
| Lo | Lo | Lo | Lo |
| Hi | Lo | Lo | Hi |
| — | Hi | Lo | Hi-Z |
| — | Lo | Hi | Hi-Z |
| — | Hi | Hi | Hi-Z |

Lo : LOW LEVEL
Hi : HIGH LEVEL
Hi-Z : HIGH IMPEDANCE

FIG. 4

| SHUT-OFF START SIGNALS | LATCH RERELEASE SIGNALS | OUTPUT |
|---|---|---|
| Lo | Lo | NO CHANGE |
| Lo | Hi | Lo |
| Hi | Lo | Hi |
| Hi | Hi | Hi |

Lo : LOW LEVEL
Hi : HIGH LEVEL

| SIGNALS FROM TEMPERATURE DETECTION DEVICE | SIGNALS FROM LATCH DEVICE | OUTPUT |
|---|---|---|
| LESS THAN TEMPERATURE THRESHOLD VALUE | Lo | Lo |
| LESS THAN TEMPERATURE THRESHOLD VALUE | Hi | Hi |
| EQUAL TO OR LARGER THAN TEMPERATURE THRESHOLD VALUE | Lo | Lo |
| EQUAL TO OR LARGER THAN TEMPERATURE THRESHOLD VALUE | Hi | Lo |

Lo : LOW LEVEL
Hi : HIGH LEVEL

POWER SUPPLY SHUT-OFF CONTROL DEVICE

CROSS REFERENCE TO RELATED APPLICATION

This application is a U.S. national stage application of PCT/JP2020/043035 filed on Nov. 18, 2020, the contents of which are incorporated herein by reference.

TECHNICAL FIELD

The present disclosure relates to a power supply control device. In particular, the present disclosure relates to control of power supply by shutting off a signal when an abnormality occurs in a target for power supply, etc.

BACKGROUND ART

A power supply control device is known that controls and supplies electric power to electric motors and other devices that are subject to electric power supply. When an abnormality, such as an out-of-control state of an electric motor, occurs, such a device is required to stop, without fail, an operation of equipment to be supplied with electric power from a standpoint of safety. When stopping the operation of the equipment, the power supply control device shuts off a driving signal transmitted to the power conversion device, such as an inverter, to thereby stop power supply to the equipment.

Here, a method is known in which a three-state buffer or the like is used to configure a safety stop circuit that shuts off a gate driving signal by a safety stop command sent from the outside, thereby shutting off the driving signal by hardware rather than by executing software (refer to, for example, Patent Literature 1).

CITATION LIST

Patent Literature

Patent Literature 1: WO2008/132975

SUMMARY OF INVENTION

Technical Problem

In a safety shut-off circuit disclosed in Patent Literature 1, an external power shut-off terminal is provided to output a safety stop command. However, methods for opening and closing the external power shut-off terminal, etc., are not described specifically. For example, manually opening and closing the external power shut-off terminal to shut off power may not satisfy functional safety standards. When the external power shut-off terminal is opened and closed electrically, it is necessary to provide a circuit outside the device that outputs a signal to operate the opening and closing of the external power shut-off terminal. As for the configuration of a circuit that outputs a signal for manipulating opening and closing such an external power terminal, there may be a case that functional safety standards are not satisfied.

Furthermore, the safety shut-off device disclosed in the above-mentioned Patent Literature 1 is configured to maintain a safe state by using a latch circuit. However, if cancellation of a latch state in the latch circuit is performed by a controller or other devices configured to execute software, the safety-shut off device may be considered to be protected by software in respect of functional safety standards.

Under such circumstances, the present disclosure has been made in order to solve the above-mentioned problem. An object of the present disclosure is to provide a power supply control device that is able to restore, after shutting off a gate driving signal, a normal state of shutting off of the gate driving signal without execution of software.

Solution to Problem

The power supply control device according to an embodiment of the present disclosure comprises: a power conversion device configured to perform power conversion to supply power to an object for power supply; a controller configured to control an operation of the power conversion device; a current detection device configured to detect a current flowing through the object for power supply; a comparison device configured to output a shut-off start signal of which a logic of output is inverted when a value of current detected by the current detection device is larger than a preset current threshold value; a shut-off device configured to shut off, based on a shut-off control signal, a conversion operation signal output by the controller to the power conversion device; a latch device configured to output the shut-off control signal based on the shut-off start signal output by the comparison device and to perform a latch operation in which the shut-off device is caused to maintain a state in which the conversion operation signal is shut off and a delay device configured to output a latch release signal after a delay time elapses since the latch device starts a latch operation, the delay time being determined by components of the delay device.

Advantageous Effects of Invention

According to an embodiment of the present disclosure; the comparison device configured to output a shut-off start signal from a current flowing through a target for power supply, the latch device configured to output a shut-off control signal, and the shut-off device configured to shut off a conversion operation signal from the control device and the delay device configured to output a latch release signal each includes hardware components. As for the delay time during which the delay device outputs a latch release signal, settings for the delay time are determined by the components of the delay device. As a result, the latch operation can be released to restore power supply to a normal state by hardware configuration without using software.

BRIEF DESCRIPTION OF DRAWINGS

Description of Embodiments

Figure 1:
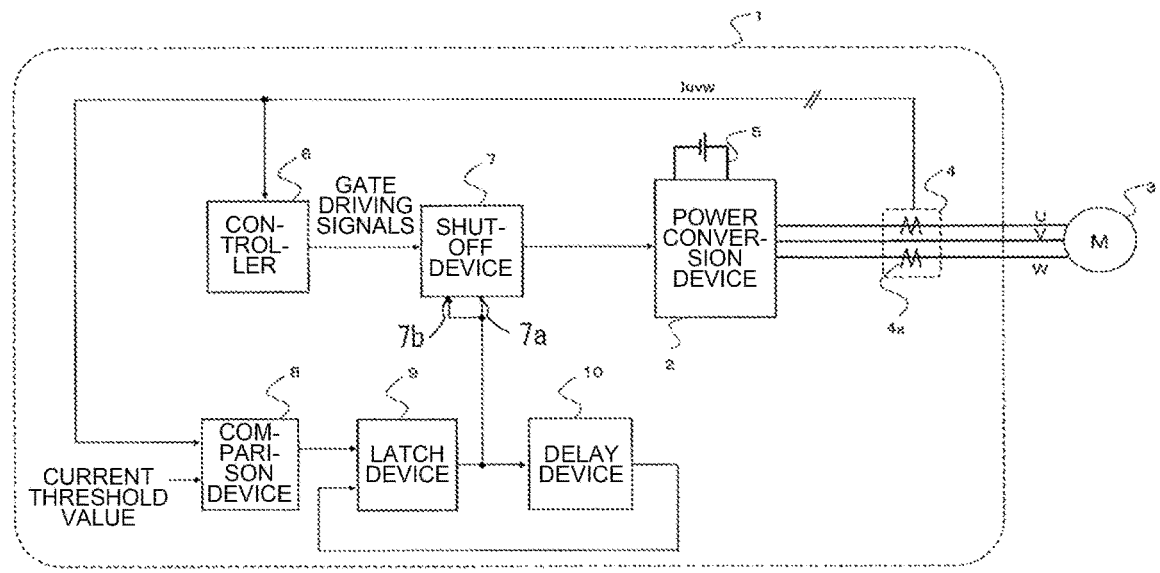

FIG. 1 is a block diagram illustrating an exemplary configuration of an electric motor system in which an electric motor control device 1 according to Embodiment 1 is mainly shown.

Figure 2:
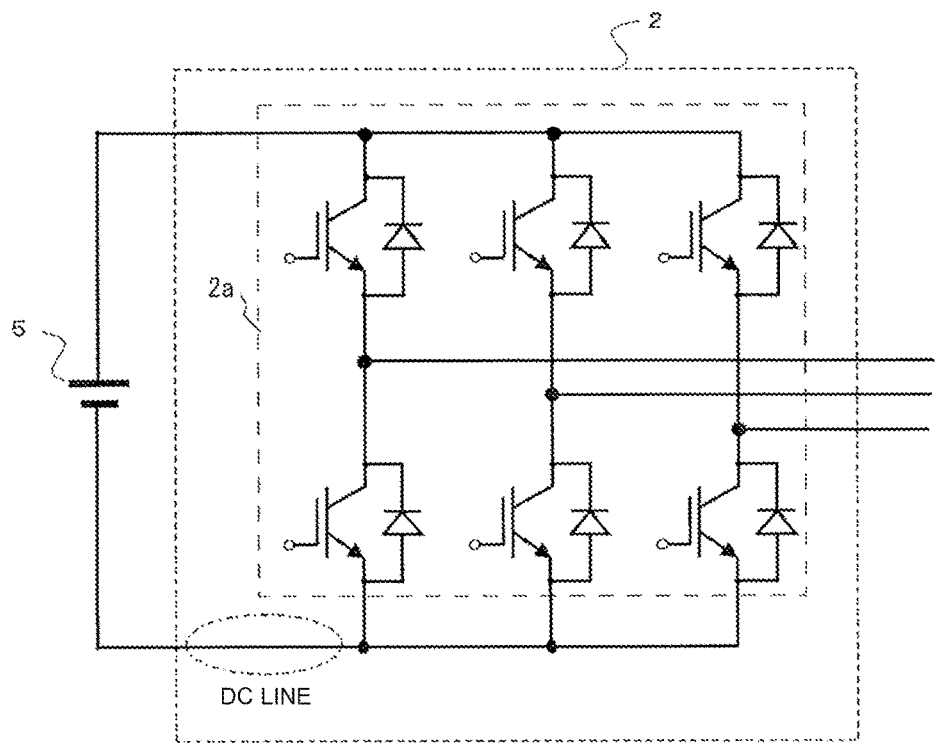

FIG. 2 is a diagram illustrating one exemplary configuration of a power conversion device 2 according to Embodiment 1 when the power conversion device is provided with an inverter circuit.

FIG. 3 is a table illustrating an example of the logic in a shut-off device 7.

FIG. 4 is a table illustrating one example of the logic in a latch device 9.

Figure 5:
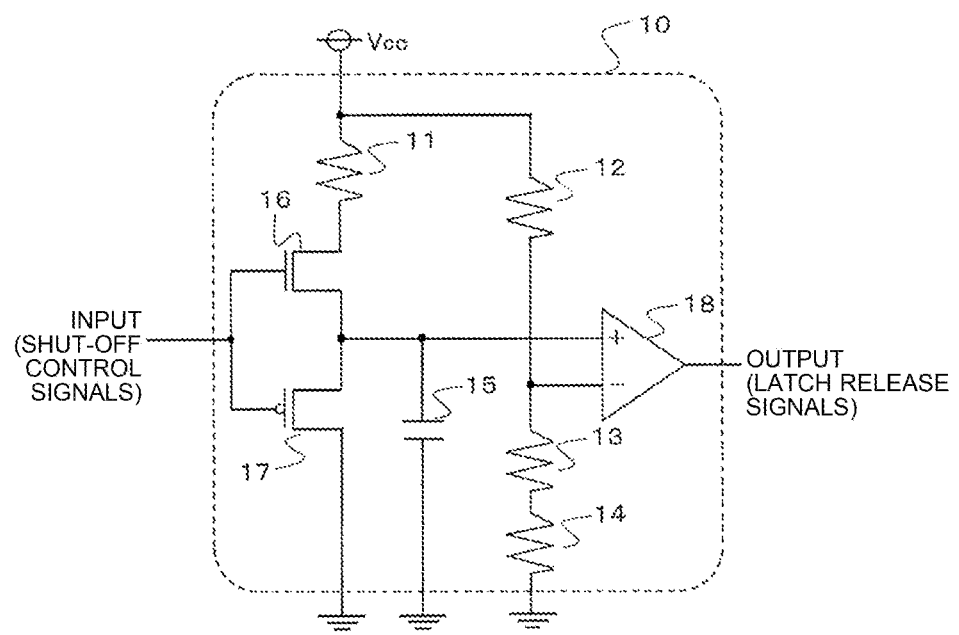

FIG. 5 is a diagram illustrating an exemplary configuration of a delay device 10.

Figure 6:
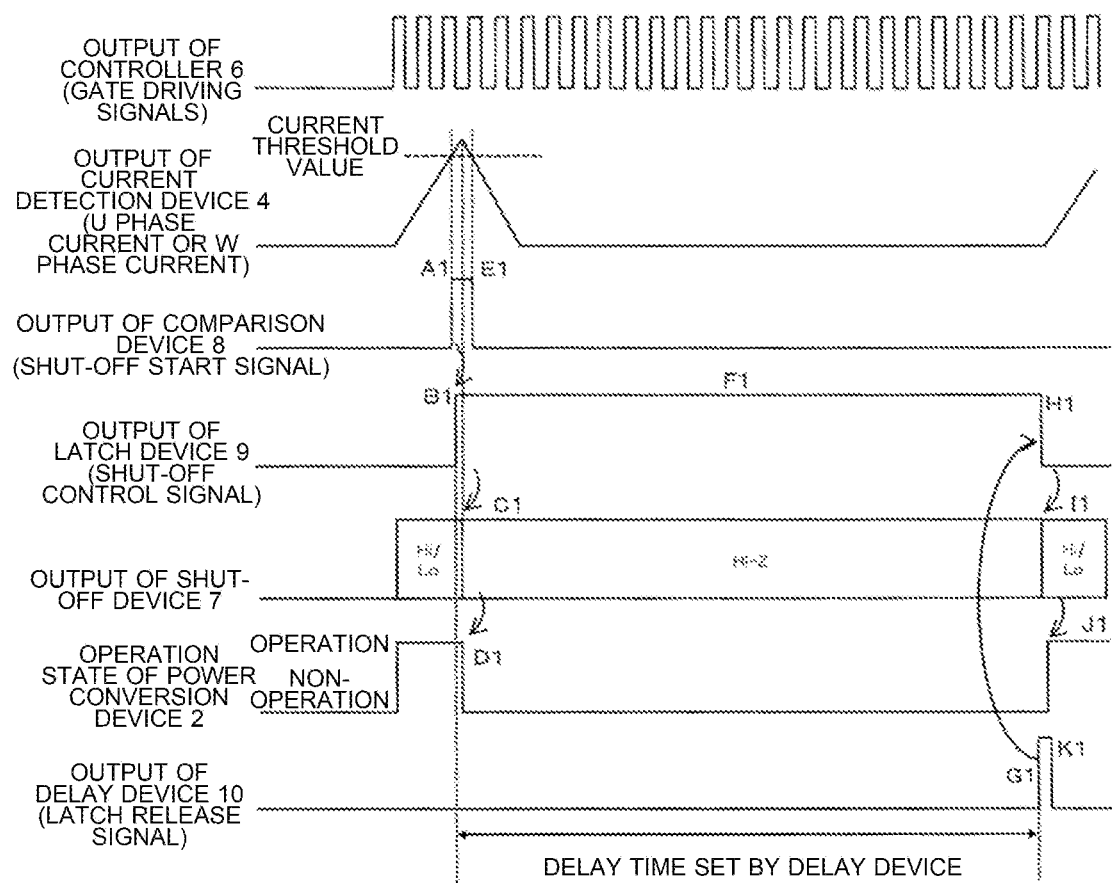

FIG. 6 is a time chart illustrating changes in signal in association with a gate shut-off operation when an overcurrent is generated in the electric motor control device 1 according to Embodiment 1.

Figure 7:
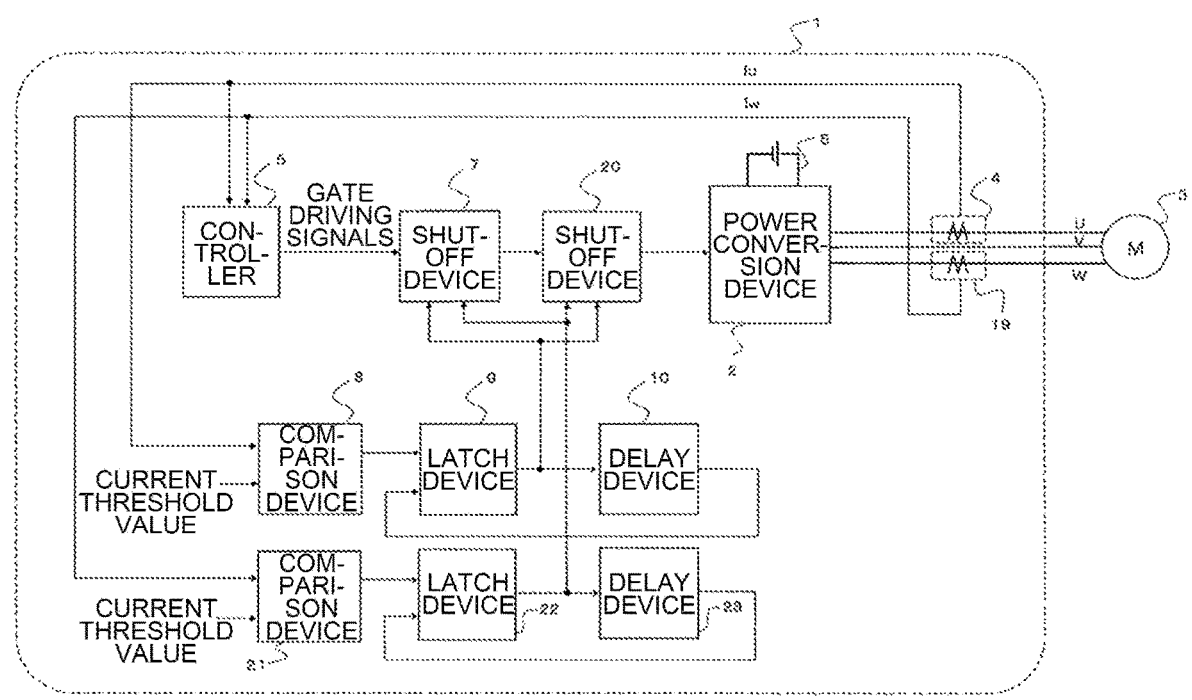

FIG. 7 is a block diagram illustrating an exemplary configuration of an electric motor system in which the electric motor control device 1 according to Embodiment 2 is mainly shown.

Figure 8:
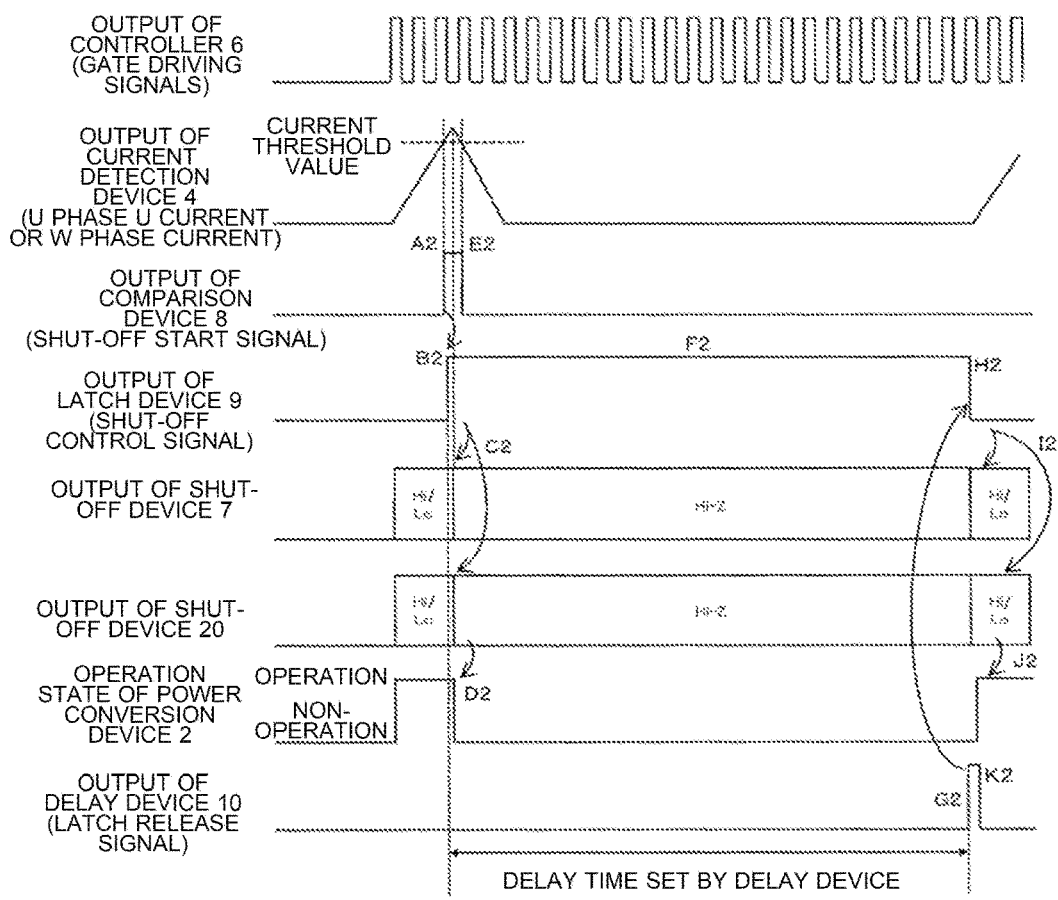

FIG. 8 is a time chart illustrating changes in signal in association with a gate shut-off operation that occurs when an overcurrent is generated in U-phase in the electric motor control device 1 according to Embodiment 2.

Figure 9:
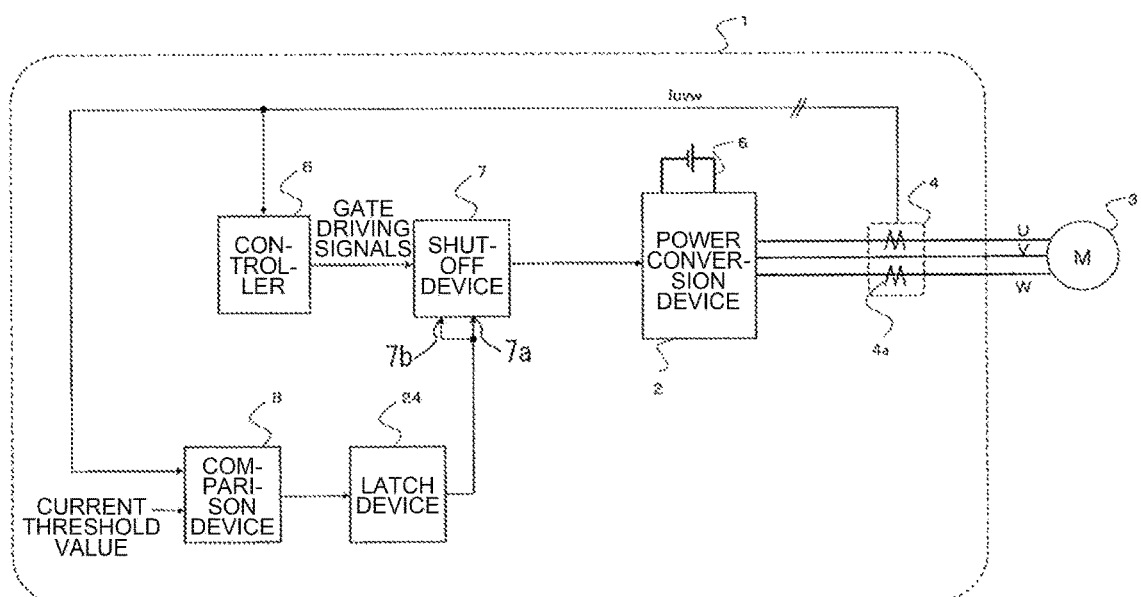

FIG. 9 is a block diagram illustrating an exemplary configuration of an electric motor system in which the electric motor control device 1 according to Embodiment 3 is mainly shown.

Figure 10:
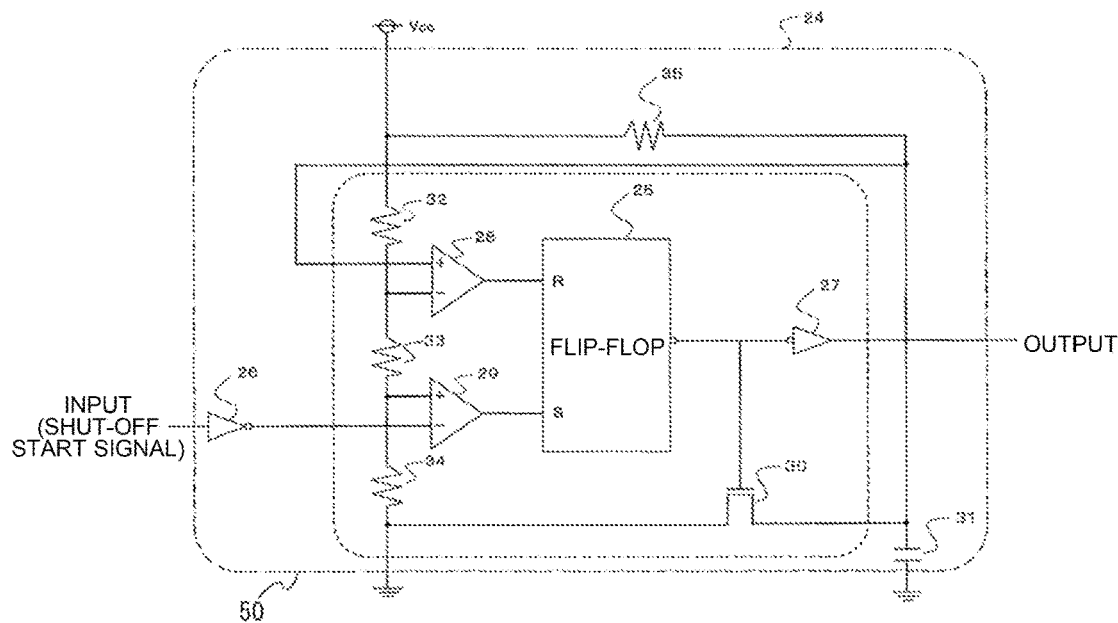

FIG. 10 is a diagram illustrating an exemplary configuration of a latch device 24.

Figure 11:
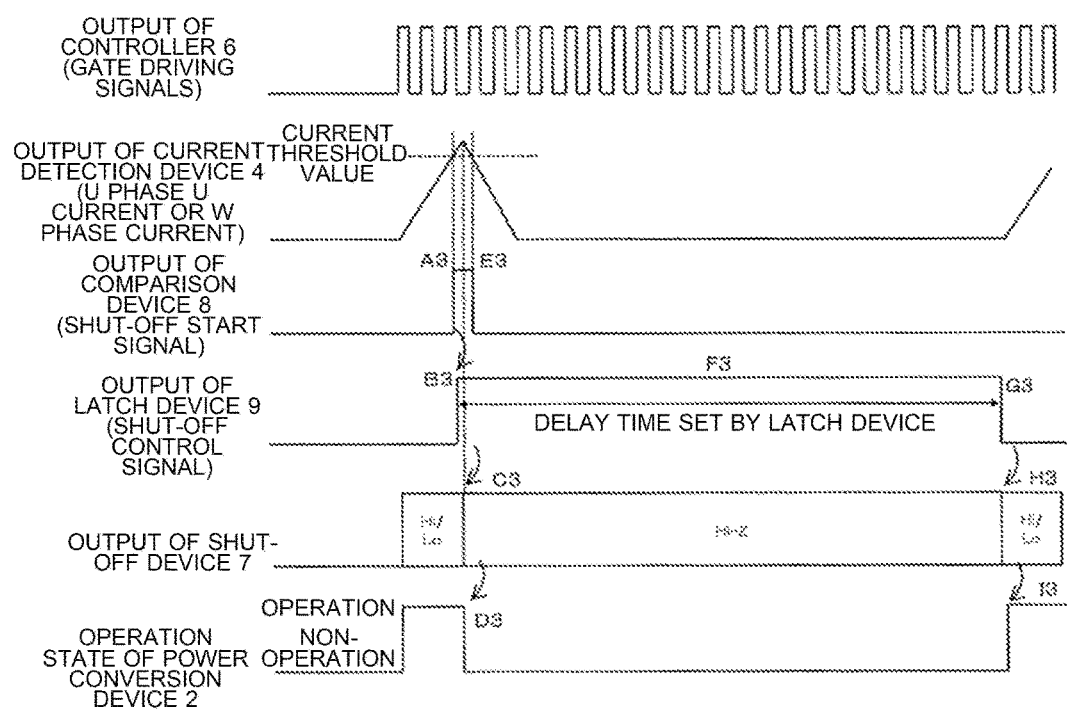

FIG. 11 is a time chart illustrating changes in signal in association with a gate shut-off operation when an overcurrent is generated in the electric motor control device 1 according to Embodiment 1.

Figure 12:
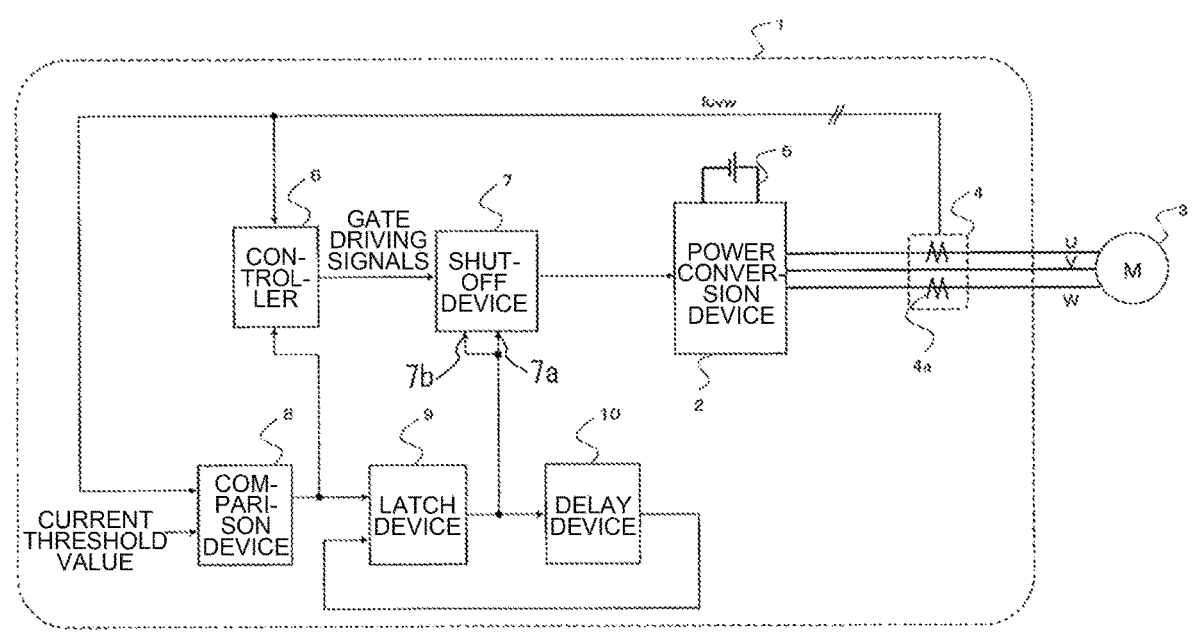

FIG. 12 is a block diagram illustrating an exemplary configuration of an electric motor system in which the electric motor control device 1 according to Embodiment 4 is mainly shown.

Figure 13:
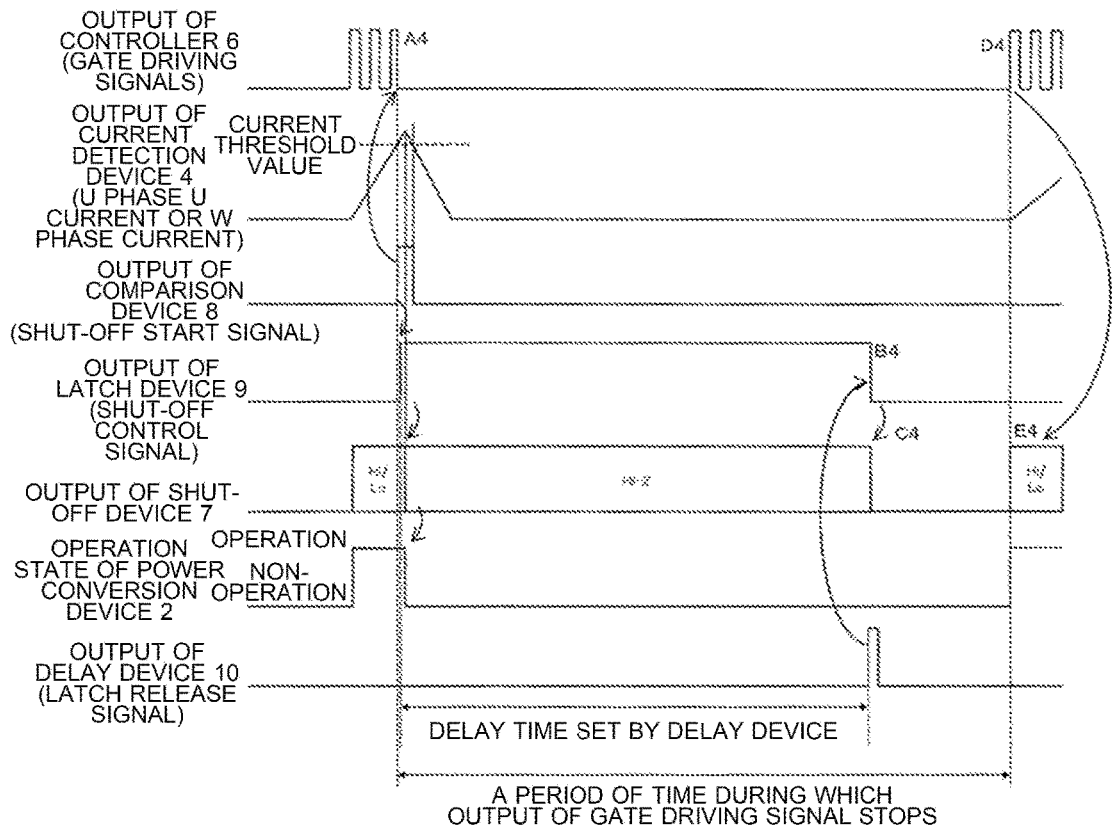

FIG. 13 is a time chart illustrating changes in signal in association with the gate shut-off operation when an overcurrent is generated in the electric motor control device 1 according to Embodiment 4.

Figure 14:
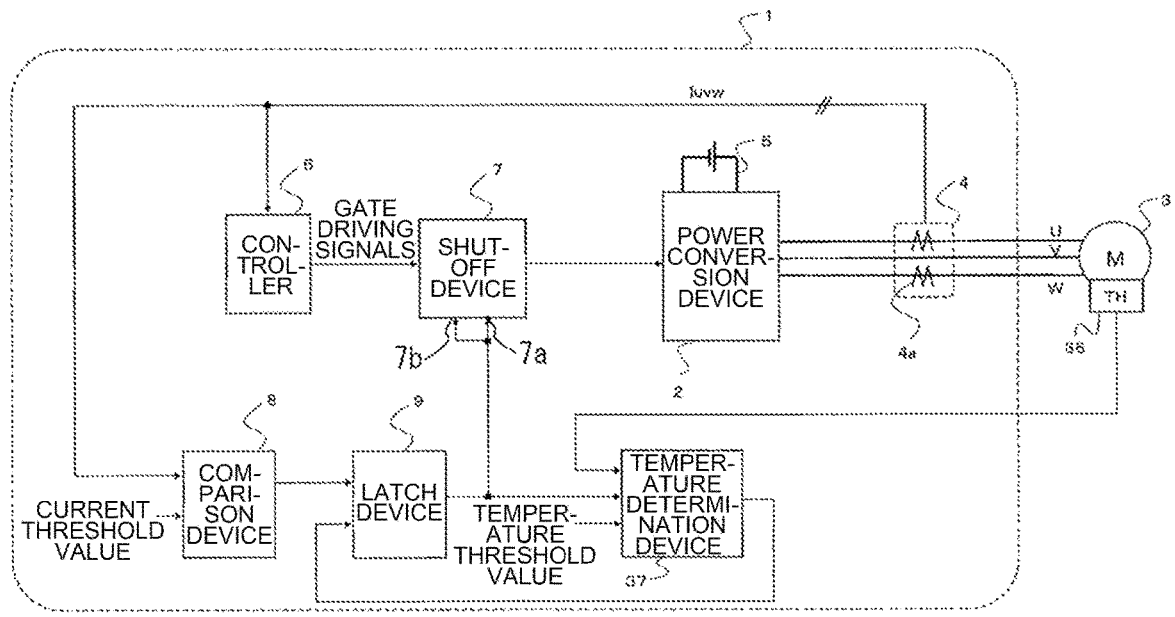

FIG. 14 is a block diagram illustrating an exemplary configuration of an electric motor system in which the electric motor control device 1 according to Embodiment 6 is mainly shown.

Figures 15, 16:
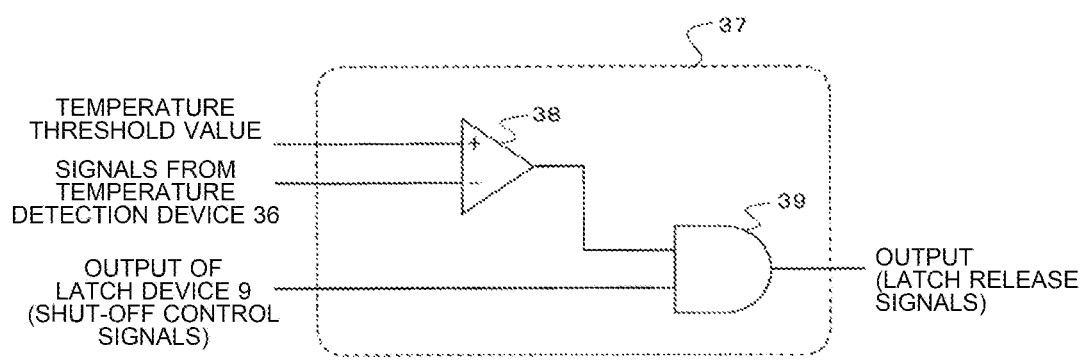

FIG. 15 is a diagram illustrating one example of the configuration of a temperature determination device 37.

FIG. 16 is a table illustrating an example of the logic of the temperature determination device 37.

Figure 17:
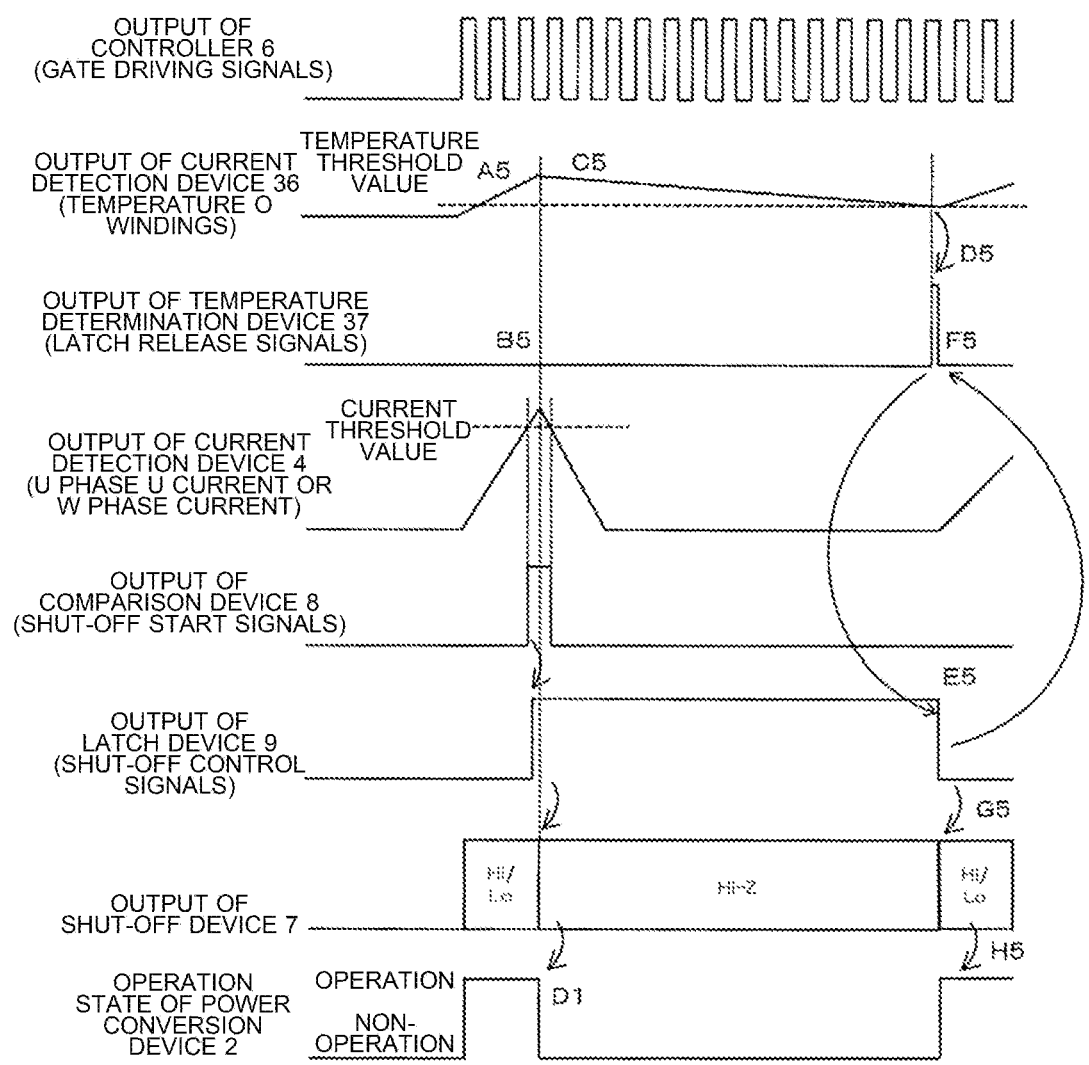

FIG. 17 is a time chart illustrating changes in signal in association with a gate shut-off operation when an overcurrent is generated in the electric motor control device 1 according to Embodiment 6.

Figure 18:
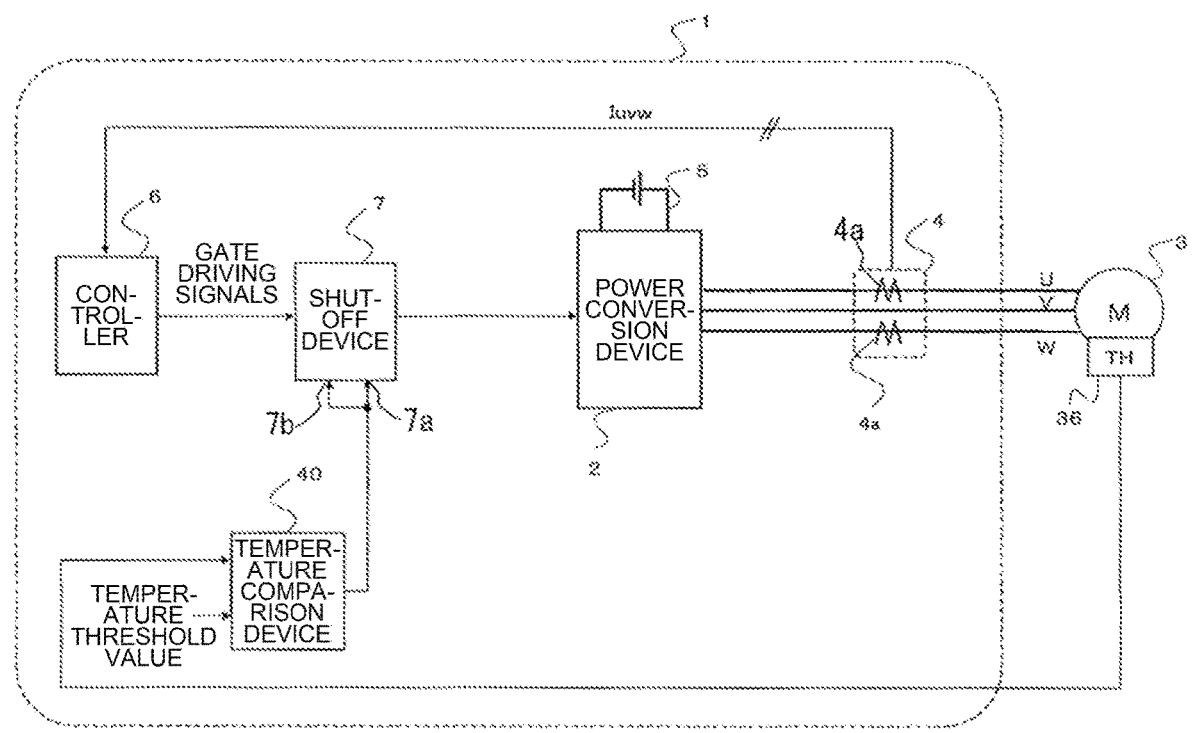

FIG. 18 is a block diagram illustrating an exemplary configuration of an electric motor system in which the electric motor control device 1 according to Embodiment 7 is mainly shown.

Figure 19:
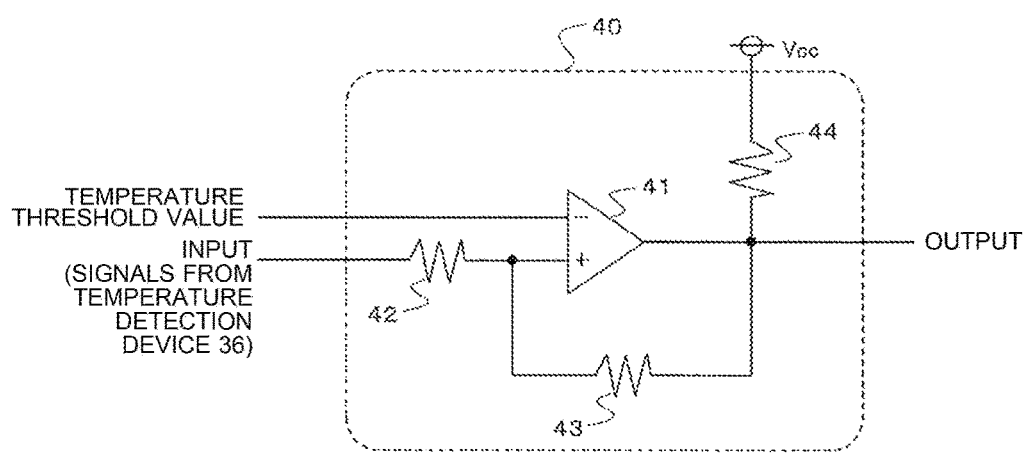

FIG. 19 is a diagram illustrating an exemplary configuration of a temperature comparison device 40.

Figure 20:
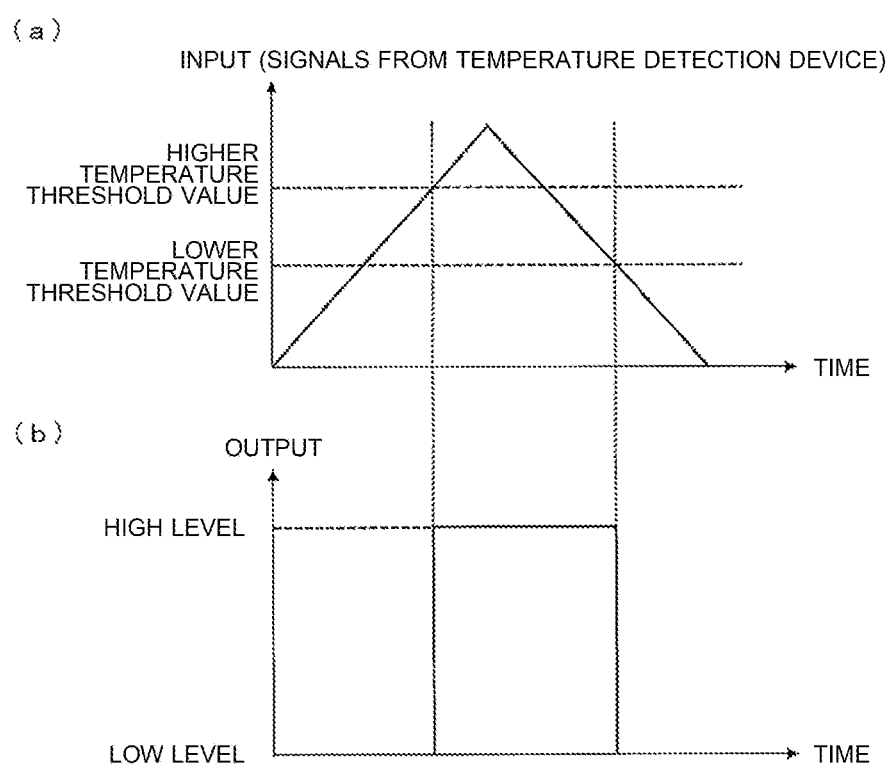

FIG. 20 includes diagrams each illustrating one example of input-output characteristics of the temperature comparison device 40.

Figure 21:
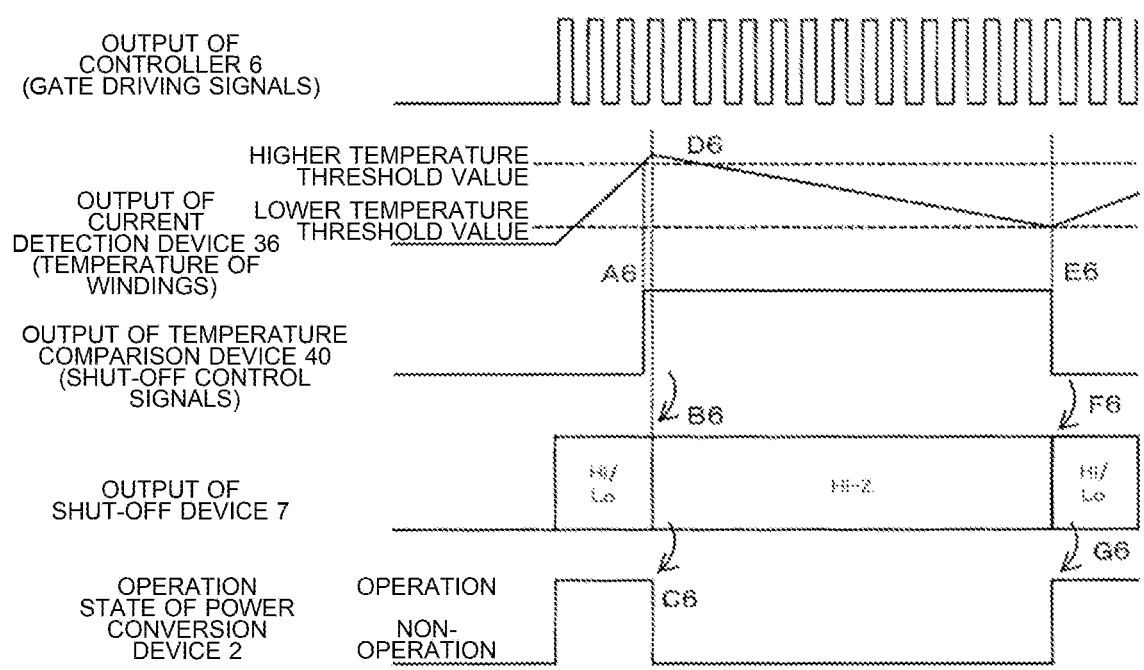

FIG. 21 is a time chart illustrating changes in signal in association with a gate shut-off operation when an overcurrent is generated in the electric motor control device 1 according to Embodiment 7.

DESCRIPTION OF EMBODIMENTS

Hereinbelow, the electric motor control device 1 according to the embodiments will be explained with reference to the drawings, etc. In the drawings, components with the same symbol are the same or equivalent, and this applies throughout the embodiments described below. In addition, the relationship of the size of each component in the drawings may differ from an actual one. The shapes or forms of the components described in the entire specification are only exemplary, and the shapes or forms of the components are not limited to those described in the specification. In particular, combination of components is not limited to only the combination in each embodiment, and the components described in one embodiment may be applied to other embodiments.

Embodiment 1

FIG. 1 is a block diagram illustrating an exemplary configuration of an electric motor system in which the electric motor control device 1 in Embodiment 1 is mainly shown. An explanation will be made on the electric motor control device 1, which is a power supply device in Embodiment 1.

The electric motor control device 1 is a device that controls power supply to an electric motor 3, which is an object for power supply, and thereby performing drive control. Here, the electric motor 3 in Embodiment 1 is a three-phase motor. The electric motor control device 1 according to Embodiment 1 has a power conversion device 2, a controller 6, a current detection device 4, a comparison device 8, a shut-off device 7, a latch device 9, and a delay device 10. The power conversion device 2 is connected to a power source 5. The controller 6 controls a conversion operation of the power conversion device 2 and performs drive control of the electric motor 3. The current detection device 4 detects a current at a point where the current detector 4a is installed and sends the detected current value to the controller 6. The comparison device 8 compares a preset current threshold value with the value of current detected by the current detection device 4, and outputs a shut-off start signal based on the results of the comparison. The shut-off device 7 performs a shut-off operation that shuts off a conversion operation signal output by the controller 6 when the controller 6 causes the power conversion device 2 to perform a conversion operation. The latch device 9 performs a latch operation that maintains the shut-off operation by the shut-off device 7 for a period of time from the input of the shut-off start signal to the input of a latch release signal. The delay device 10 outputs the latch release signal when a delay time determined by the hardware components elapses after the latch device 9 starts a latch operation. A further detailed explanation will be made on these devices, or the like.

The power source 5 is a DC voltage power source that supplies power to the electric motor 3 via the power conversion device 2. In Embodiment 1, an explanation is made based on a case where the power source 5 is a DC voltage power source. Here, the power source 5 may be one in which an AC voltage from an AC voltage source such as a single phase power source (not illustrated) or a three-phase power source (not illustrated) provided outside is converted to a DC voltage by a rectifying circuit (not illustrated), and supplies power to the power conversion device 2. In FIG. 1, the electric motor control device 1 is illustrated on a presumption that it has the power source 5, but this is not restrictive. The power source 5 may be an external power source device.

FIG. 2 is a diagram illustrating an exemplary configuration of the power conversion device 2 in Embodiment 1 with an inverter circuit. The power conversion device 2 is a device that controls power supply to the electric motor 3 by converting DC voltage to AC voltage based on a conversion operation signal sent from the controller 6 described below. The inverter circuit has a power module 2a. The power module 2*a* is a package of elements that perform power conversion and other functions housed in a housing (module). When the inverter circuit is a three-phase output inverter, the power module 2*a* houses 6 arms each include a switching element that is a power supply semiconductor device such as IGBT and a diode being connected in parallel to each other. In the power module 2*a* according to Embodiment 1, the two arms are paired, and there are three arms for each phase. The multiple switching elements in each arm are driven based on the conversion operation signal output by the controller 6 described below, and perform a switching operation to turn on or off at a predetermined timing.

The controller 6 calculates a controlled variable required to control and drive the electric motor 3. The controlled variable is, for example, a voltage command value on the output side of the power conversion device 2. The controller 6 then outputs the conversion operation signal to the power conversion device 2, which cause the power conversion device 2 to perform a conversion operation by which power is supplied to the electric motor 3 based on the controlled variable. Here, in the power conversion device 2 according to Embodiment 1, a gate driving signal is sent to the gates of the switching elements housed in the power module 2*a*, and the switching elements are driven to perform the conversion operation. Therefore, the following description is made based on a presumption that the gate driving signal is a conversion operation signal. The controller 6 is, for example, a piece of hardware, the example of which includes a control arithmetic processing device such as a central processing unit (CPU), a microcomputer including analog circuits, digital circuits, etc.

The current detection device 4 detects the three-phase current Iuvw flowing in the electric motor 3. In the configuration shown in FIG. 1, the current detection device 4 has a current detector 4*a*. The current detector 4*a* is, for example, a current transformer. Here, the current detector 4*a*, which detects the current flowing in the U-phase, will be described.

Here, a position at which the controller 6 detects a current to be used as data for control is not limited to the position shown in FIG. 1, Instead of providing the current detection device 4, a current detection section prepared by using a shunt resistor may be provided in the power conversion device 2 to detect the current. The phase in which the current detection device 4 detects the current is not limited to the phase shown in FIG. 1. For example, a current in other phases may be detected by the current detector 4*a*. A configuration may be used in which a current in the U-phase and a current in the W-phase are detected, and a current flowing in the DC line shown in FIG. 2 is detected by a current detection section provided in the power conversion device 2.

The comparison device 8 outputs a signal that serves as a shut-off start signal as a result of comparison between a preset current threshold value and a value of current detected by the current detection device 4. The shut-off start signal is a signal whose logic is inverted according to the relationship between the value of the current detected by the current detection device 4 and the current threshold value. In Embodiment 1, the shut-off start signal output by the comparison device 8 is a positive logic signal that is high when the detected current value is greater than the current threshold value, but they may also be a negative logic signal. The comparison device 8 is, for example, a comparator. The comparator compares a voltage that is the preset current threshold value with a voltage applied to a current detected by the current detection device 4.

The preset current threshold value is, for example, a voltage obtained by dividing the power supplied to drive the controller 6 and the comparison device 8 by a resistance value. A voltage divider resistance for voltage division is selected so that the voltage applied to the current detected by the current detection device 4 is served as the current threshold value when a current equivalent to the current value at which the gate driving signal is to be shut off flows.

Here, in order to improve safety reliability, voltages at different locations may be used as current threshold values for each current. When the design values of the current threshold values for each current are to be made equal to each other, reliability is expected to be improved by using the voltages at different locations that are theoretically the same voltage as the current threshold values for each current. The voltages at different locations that are theoretically the same voltage are, for example, voltages applied by the same power supply and divided by different individual resistors of equal resistance value.

FIG. 3 is a table illustrating an example of the logic in the shut-off device 7. The shut-off device 7 is a device that shuts off the gate driving signal according to a shut-off control signal input to the shut-off device 7. The shut-off device 7 is, for example, a tri-state buffer. As shown in FIG. 3, the shut-off device that is a tri-state buffer has its output in a high impedance state if at least one of the shut-off control signal that is input to a control terminal 7*a* shown in FIG. 1 and the shut-off control signal that is input to a control terminal 7*b* shown in FIG. 1, is a high level signal. When the output is in a high impedance state; the gate driving signal is not input to the power conversion device 2 and is shut off.

In Embodiment 1, an explanation is made on the presumption that the shut-off device 7 performs a shut-off operation to shut-off the gate driving signal when the shut-off control signal is a high level signal, but it may also perform the shut-off operation when the shut-off control signal is a low level signal.

FIG. 4 is a table illustrating one example of the logic in the latch device 9. The latch device 9 is, for example; a flip-flop. The latch device 9 according to Embodiment 1 inverts the logic of the output when the shut-off start signal is input, and maintains the logic of the output even after the shut-off start signal is no longer input. When a latch release signal is input to the latch device 9 after the shut-off start signal is input; the logic of the output is inverted again to cause the state to be the output state before the shut-off start signal is input.

Here, in Embodiment 1, the latch release signal is presumed to be a positive logic signal, but it may be a negative logic signal. The latch device 9 in Embodiment 1 is presumed to be a device that switches its output from low to high when the shut-off start signal is input, but this is not restrictive. For example, the device may be a device that switches its output from high to low when the shut-off start signal is input.

FIG. 5 is a diagram illustrating an exemplary configuration of a delay device 10. The delay device 10 outputs a latch release signal to cancel the latch operation of the latch device when a delay time determined by setting elapses after the shut-off control signal is input to start the latch operation of the latch device 9. In Embodiment 1, the shut-off control signal, which is the output of the latch device 9, serves as a trigger that causes the delay device 10 to start operation. In the delay device 10 shown in FIG. 5, when the signal is a high level signal, an N-channel MOSFET 16 is turned on and charging of the capacitor 15 starts. Subsequently, when the voltage of the capacitor 15 rises, the output of the comparator 18 turns to be high, and the latch release signal is output. A time required to charge the capacitor 15 is determined by the capacitance of the capacitor 15 and the resistance value of a resistor 11. The time required to charge the capacitor 15 is used to achieve a delay from a point of time at which the shut-off control signal is input to a point of time at which the latch release signal is output. In the delay device 10 shown in FIG. 5, resistance values of resistors 12, 13, and 14 are of the same magnitude. In this case, the delay time from the input of the shut-off control signal to the output of the latch release signal are approximately 1.1×capacitance of capacitor 15×resistance values [sec] of resistor 11. Thus, the delay time is determined by the components used as the hardware. When the shut-off control signal is no longer input, a P-channel MOSFET 17 is turned on and the capacitor 15 is discharged through the P-channel MOSFET 17. When the capacitor 15 is discharged, the output of the comparator 18 turns to be low and the output of the latch release signal stops.

In order to protect the electric motor 3, which is an object to be protected from a temperature rise due to an overcurrent, the delay time of the delay device 10 is set to an operation suspension time of the electric motor 3 that is required to lower the temperature of the electric motor 3, which rises due to overcurrent, to an appropriate temperature, for example. For example, the operation suspension time is determined as follows. When the operation of applying an overcurrent to the electric motor 3 and shutting off the gate of the switch element of the power conversion device 2 is repeated at a fixed time interval, a time interval at which the temperature of the electric motor 3 can be guaranteed to be saturated at a temperature below a specified value is experimentally obtained. Here, the electric motor 3 to be supplied with power is the target of protection, but the target of protection may be different.

FIG. 6 is a time chart illustrating changes in signal in association with a gate shut-off operation when an overcurrent is generated in the electric motor control device 1 according to Embodiment 1. Next, the operation of the electric motor control device 1 according to Embodiment 1 will be described.

When an overcurrent is generated and the current value detected by the current detection device 4 becomes larger than the current threshold value, the comparison device 8 outputs the shut-off start signal (A1 in FIG. 6). When the shut-off start signal is output, the output of the latch device 9 switches from low to high (B1 in FIG. 6). When the output of the latch device 9, which is used as the shut-off control signal for the shut-off device 7 turns to be high, the output of the shut-off device 7 is in a high impedance state (C1 in FIG. 6). When the output of the shut-off device 7 is in a high impedance state, the power conversion device 2 stops its operation (D1 in FIG. 6). Thereafter, the current value detected by the current detection device 4 becomes smaller than the current threshold value, and the output of the shut-off start signal stops (E1 in FIG. 6). Even when the output of the shut-off start signal stops, the latch device 9 maintains the logic of the output at a high level (F1 in FIG. 6). After a time preset by the delay device 10 elapses since the output of the latch device 9, which is a start signal of the delay device 10, turns to be high, the output of the delay device 10 switches to high (G1 in FIG. 6). When the output of the delay device 10, which is used as the latch release signal for the latch device 9, turns to be high, the output of the latch device 9 switches to low (H1 in FIG. 6). When the output of the latch device 9 turns to be low, the output of the shut-off device 7 is no longer in a high impedance state, whereby the output of the shut-off device 7 turns to be low or high depending on the gate driving signal (I1 in FIG. 6). The output of the shut-off device 7 is no longer in a high impedance state, and the power conversion device 2 operates (J1 in FIG. 6). When the output of the latch device 9 turns to be low, the output of the delay device 10 also turns to be low (K1 in FIG. 6).

In FIG. 6, for a period of time during which the output of the latch device 9 is high, i.e. a period of time during which the shut-off device 7 continues performing a shut-off operation, the controller 6 continues outputting the gate driving signal. This is, however, not restrictive. When the output of the latch device 9 turns to be high, the controller 6 may stop outputting the gate driving signal.

Next, the actions and effects of Embodiment 1 will be described. According to the electric motor control device 1 of Embodiment 1, the three-phase current Wm flowing in the electric motor 3 is used as a trigger to shut off the gate driving signal. Therefore, excessive heat generation in the electric motor 3 can be prevented. By using the three-phase current Iuvw flowing in the electric motor 3, a circuit required to perform a gate shut-off operation does not need to be provided outside the electric motor control device 1, and as a result, the circuit configuration can be simplified comparatively. In the electric motor control device 1 according to Embodiment 1, when a gate shut-off operation is performed, the gate driving signal is maintained in the shut-off state, and the gate driving signal can be transitioned from a state in which the gate driving signal is shut off to a state in which the gate driving signal is transmitted by hardware operation without using software. By realizing the transition from the state in which the gate driving signal is shut-off to the state in which the gate driving signal is transmitted by hardware, it is possible to prevent dangerous operations such as a transition from the state in which the gate driving signal is shut off to the state in which the gate driving signal is transmitted earlier than expected due to an uncontrollable state of the controller 6 or other dangerous operations that occur since processing by software is not performed at an intended timing. The delay time is set such that the delay time is a time required for the electric motor 3 to be suspended so as to allow the temperature of the electric motor 3, which has increased due to the overcurrent, to decrease to an appropriate temperature. Therefore, even if the controller 6 does not stop outputting the gate driving signal after the overcurrent is generated and the overcurrent flows repeatedly at regular time intervals, the electric motor 3 can still be cooled. Therefore, excessive heat generation in the electric motor 3 can be prevented. In the electric motor control device 1 according to Embodiment 1, a series of operations related to stopping of the electric motor 3 when an abnormality occurs can be performed by implementing hardware operations without using software. Therefore, in respect of functional safety standards, it is not considered protection is performed by using software, and software standard compliance is not required.

Embodiment 2

FIG. 7 is a block diagram illustrating an exemplary configuration of the electric motor system in which the electric motor control device 1 according to Embodiment 2 is mainly shown. The electric motor control device 1 of Embodiment 2 is different from the electric motor control device 1 of Embodiment 1 in that it includes, in addition to a combination of the current detection device 4, the comparison device 8, the latch device 9, and the delay device 10, also includes a combination of a current detection device 19, a comparison device 21, a latch device 22 and a delay device 23. The electric motor control device 1 according to Embodiment 2 differs from the electric motor control device 1 according to Embodiment 1 in that it has a shut-off device 20. Here, the shut-off device 20 is presumed to have the same configuration as that of the shut-off device 7. However, this is not restrictive. For example, one device may be an inverting buffer and the other may be a non-inverting buffer. It has a configuration that the gate driving signal is shut off by allowing either one of the shut-off device 7 and the shut-off device 20 installed in a signal path between the controller 6 and the power conversion device 2 to perform a shut-off operation. In Embodiment 2, the same symbols are used for the same components as those described in Embodiment 1.

The configuration of the electric motor control device 1 according to Embodiment 2 will be described below. Here, points that differ from Embodiment 1 will be explained. The current detection device 4 detects a current in U-phase as in Embodiment 1. On the other hand, the current detection device 19 according to Embodiment 2 detects the current in W-phase. Here, in Embodiment 2, as in Embodiment 1, the position at which the current is detected is not limited to the position shown in FIG. 7.

The output of the current detection device 4 is input to the comparison device 8, and the output of the current detection device 19 is input to the comparison device 21. The output of the comparison device 8 is input to the latch device 9 and the delay device 10, and the output of the comparison device 21 is input to the latch device 22 and the delay device 23. The output of the delay device 10 is input to the latch device 9, and the output of the delay device 23 is input to the latch device 2. The output of the latch device 9 is input to the shut-off device 7 and the shut-off device 20, and the output of the latch device 22 is input to the shut-off device 7 and the shut-off device 20. Here, the positions to which the latch device 9 and the latch device 22 are connected are not limited to the positions shown in FIG. 7. For example, the output of the latch device 9 may be input to the shut-off device 7, and the output of the latch device 22 may be input to the shut-off device 2.

FIG. 8 is a time chart illustrating changes in signal in association with a gate shut-off operation when an overcurrent is generated in U-phase in the electric motor control device 1 according to Embodiment 2. Next, an operation of the electric motor control device 1 according to Embodiment 2 will be explained.

When an overcurrent is generated in Li-phase and the current value detected by the current detection device 4 exceeds the current threshold value, the comparison device 8 outputs a shut-off start signal (A2 in FIG. 8). When the shut-off start signal is output, the output of the latch device 9 switches from low to high (B2 in FIG. 8). When the output of the latch device 9, which is used as the shut-off control signal of the shut-off device 7 and the shut-off control signal of the shut-off device 20, turns to be high, the output of the shut-off device 7 and the output of the shut-off device 20 turn to be in a high impedance state (C2 in FIG. 8). The output of the shut-off device 7 and the output of the shut-off device 20 are in a high impedance state, which causes the power conversion device 2 to stop its operation (D2 in FIG. 8). Thereafter, a current value detected by the current detection device 4 become smaller than the current threshold value, and the output of the shut-off start signal stops (E2 in FIG. 8). However, even if the output of the shut-off start signal stops, the latch device 9 maintains the logic of the output at a high level (F2 in FIG. 8). When a delay time set by the delay device 10 elapses after the output of the latch device 9, which is a start signal of the delay device 10, turns to be high, the output of the delay device 10 switches to high (G2 in FIG. 8). When the output of the delay device 10, which is used as the latch release signal for the latch device 9 turns to be high, the output of the latch device 9 switches to low (H2 in FIG. 8). When the shut-off control signal, which is the output of the latch device 9, turns to be a low level signal, the output of the shut-off device 7 and the output of the shut-off device 20 are no longer in a high impedance state. Therefore, the output of the shut-off device 7 and the output of the shut-off device 20 are either low or high, depending on the gate driving signal (I2 in FIG. 8). As the outputs of the shut-off device 7 and the shut-off device 20 are no longer in a high impedance state, the gate driving signal is input to the power conversion device 2, whereby the power conversion device 2 operates (J2 in FIG. 8). When the output of the latch device 9 turns to be low, the output of the delay device turns to be low (K2 in FIG. 8).

The time chart relating to shut-off when an overcurrent is generated in W-phase is a time chart, in the time chart shown in FIG. 8, obtained by changing the U-phase current to the W-phase current, changing the comparison device 8 to the comparison device 21, changing the latch device 9 to the latch device 22, and changing the delay device 10 to the delay device 23.

The actions and effects of Embodiment 2 will be described below. In the electric motor control device 1 according to Embodiment 2, by providing a plurality of combinations of sets of the current detection device 4, the comparison device 8, the shut-off device 7, the latch device 9, and the delay device 10, the devices related to protection can be made redundant, thus improving the safety reliability of the system.

Embodiment 3

The electric motor control device 1 according to Embodiment 3 differs from the electric motor control device 1 according to Embodiment 1 in that the latch device 9 includes the functions of the delay device 10 described in Embodiment 1. In Embodiment 3, the same symbols are used for the same components as those described in Embodiment 1.

FIG. 9 is a block diagram illustrating an exemplary configuration of the electric motor system in which the electric motor control device 1 in Embodiment 3 is mainly shown. The configuration of the electric motor control device 1 of Embodiment 3 will be described below. In Embodiment 3, points that differ from Embodiment 1 will be explained. The electric motor control device 1 of Embodiment 3 differs from the electric motor control device 1 of Embodiment 1 in that it has a latch device 24.

FIG. 10 is a diagram illustrating an exemplary configuration of the latch device 24. The latch device 24 shown in FIG. 10 includes a timer IC device 50, a resistor 35, capacitor 31, and a NOT gate 26. The timer IC device 50, represented by the dashed portion in FIG. 10, is a device that causes the time of signal input to be delayed and outputs the delayed time. The timer IC device 50 is a circuit configured by combining functions of a flip-flop 25, a NOT gate 27, a comparator 28, a comparator 29, an N-channel MOSFET 30, a resistor 32, a resistor 33, and a resistor 34.

In the latch device 24 shown in FIG. 10, when the shut-off start signal is input, the output of the comparator 29 turns to be high and the output of the flip-flop 25 turns to be low.

When the output of the flip-flop 25 turns to be low, the NOT gate 27 at a downstream side of the flip-flop 25 causes the output of the latch device 24 to be high. The logic of the output is maintained after the shut-off start signal is no longer input due to the action of the flip-flop 25. When the output of the flip-flop 25 turns to be low, the N-channel MOSFET 30 is turned off and charging of the capacitor 31 starts. Then, as the voltage of capacitor 31 rises, the output of the comparator 28 turns to be high and the output of the flip-flop 25 turns to be high. When the output of flip-flop turns to be high, the NOT gate 27 at a downstream side of the flip-flop 25 causes the output of the latch device 24 to turn to be low. When the output of the flip-flop 25 turns to be high, the N-channel MOSFET30 is turned on and the capacitor 31 is charged through the N-channel MOSFET30. The time required to charge the capacitor 31 is determined by the capacitance of the capacitor 31 and the resistance value of a resistor 35. The time required to charge the capacitor 31 is determined by a time during which the output of the latch device 24 remains high. In the latch device 24 shown in FIG. 10, presuming that the resistance values of the resistor 32, the resistor 33, and the resistor 34 are of the same magnitude, the time during which the output of the latch device 24 remains high is roughly 1.1×the capacitance of the capacitor×the resistance value of the resistor 35 [sec].

FIG. 11 is a time chart illustrating changes in signal in association with a gate shut-off operation when an overcurrent is generated in the electric motor control device 1 according to Embodiment 3. Next, operation of the electric motor control device 1 according to Embodiment 3 will be explained.

When an overcurrent is generated and the current detection value detected by the current detection device 4 exceeds the current threshold value, the comparison device 8 outputs a shut-off start signal (A3 in FIG. 11). When the shut-off start signal is output, the output of the latch device 24 switches from low to high (B3 in FIG. 11). When the output of the latch device 24, which is used as the shut-off control signal for the shut-off device 7, turns to be high, the output of the shut-off device 7 is in a high impedance state (C3 in FIG. 11). When the output of the shut-off device 7 turns to be in a high impedance state, the power conversion device 2 stops (D3 in FIG. 11). Thereafter, the current value detected by the current detection device 4 becomes smaller than the current threshold value, and the output of the shut-off start signal stops (E3 in FIG. 11). Even after the output of the shut-off start signal stops, the latch device 24 maintains the logic of the output at a high level (F3 in FIG. 11). After the time set in advance by the latch device 24 elapses after the output of the latch device 24 turns to be high, the output of the latch device 24 switches to low (G3 in FIG. 11). When the output of the latch device 24 turns to be low, the output of the shut-off device 7 is no longer in a high impedance state, so the output of the shut-off device 7 turns to be either low or high depending on the gate driving signal (H3 in FIG. 11). When the output of the shut-off device 7 is no longer in a high impedance state, the power conversion device 2 starts operating (I3 in FIG. 11).

The actions and effects of Embodiment 3 will be described below. According to the electric motor control device 1 according to Embodiment 3, the latch device 24 can be configured by using a general-purpose timer IC device 50 and thus it can be configured relatively easily. In addition, the number of components can be reduced due to the use of the general-purpose timer IC device 50.

Embodiment 4

The electric motor control device 1 according to Embodiment 4 differs from the electric motor control device 1 according to Embodiment 1 in that constraints are additionally imposed on the method of setting the delay time. In Embodiment 4, the same symbols are used for the same components as those described in Embodiment 1.

FIG. 12 is a block diagram illustrating an exemplary configuration of an electric motor system in which the electric motor control device 1 according to Embodiment 4 is mainly shown. The configuration of the electric motor control device 1 according to Embodiment 4 will be described below. In Embodiment 4, points that differ from Embodiment 1 will be explained. In Embodiment 4, the shut-off start signal output by the comparison device 8 is also input to the controller 6. Then, based on the shut-off start signal, the controller 6 stops outputting the gate driving signal when an abnormality occurs.

A period of time during which the controller 6 stops outputting the gate driving signal in the event of an abnormality is set by software executed by the controller 6. The period of time, which is set by software, during which output of the gate driving signal stops, is, for example, a maximum allowable downtime for the system in which the electric motor control device 1 is installed.

At this time, the delay time set in the delay device 10 is less than or equal to a period of time during which output of the gate driving signal stops, which is set by software. Therefore, the hardware of the delay device 10 includes components selected in consideration of the period of time during which output of the gate driving signal stops.

FIG. 13 is a time chart illustrating changes in signal in association with a gate shut-off operation when an overcurrent is generated in the electric motor control device 1 according to Embodiment 4. Next, an operation of the electric motor control device 1 according to Embodiment 4 will be described.

When the shut-off start signal is output, the controller 6 stops outputting the gate driving signal (A4 in FIG. 13). After the time set by the delay device 10 elapses after the output of the latch device 9 turns to be high, the output of the latch device 9 switches to low (B4 in FIG. 13). When the output of the latch device 9 turns to be low, the output of the shut-off device 7 is no longer in a high impedance state, and the output of the shut-off device 7 switches to low (C4 in FIG. 13). When the time set by software, during which output of the gate driving signal stops, elapses after the controller 6 stops outputting the gate driving signal, the controller 6 outputs the gate driving signal (D4 in FIG. 13). The output of the shut-off device 7 turns to be low or high depending on the gate driving signal (E4 in FIG. 13).

The actions and effects of Embodiment 4 will be described below. When the delay time of the delay device 10 is longer than a period of time set by software during which the output of the gate driving signal stops, if false detection of an overcurrent, etc. occurs, the electric motor control device 1 stops for a period of time equal to or longer than a period of time during which the system in which the electric motor control device 1 is installed can withstand. Thus, the operation of the system may be adversely affected. In the electric motor control device 1 of Embodiment 4, the delay time of the delay device 10 is shorter than or equal to the gate driving signal output stop time set by software. Therefore, even in the case where false detection of an overcurrent, etc. occurs, the system operation will not be adversely affected.

Embodiment 5

The electric motor control device 1 according to Embodiment 5 differs from the electric motor control device 1 according to Embodiment 1 in that constraints are added regarding the method for setting a current threshold value. In Embodiment 5, the same symbols are used for the same components as those described in Embodiment 1.

In Embodiment 5, the controller 6 stops the output of the gate driving signal when the output of the current detection device 4 input to the controller 6 is greater than the software current threshold value set by the software executed by the controller 6. If the electric motor 3 is a permanent magnet synchronous motor, the software current threshold value is, for example, a current value at which the permanent magnet is not demagnetized.

A set current threshold value set in the comparison device 8 is made larger than the software current threshold value. The set current threshold value is set by the voltage divider resistor, as described above.

Next, the operation of the electric motor control device 1 according to Embodiment 5 will be described. The configuration of the electric motor control device 1 according to Embodiment 5 is presumed to be the same as that of Embodiment 1. When the controller 6 operates normally, if an overcurrent flows, the output of the current detection device 4 input to the controller 6 exceeds the software current threshold value, and the controller 6 stops outputting the gate driving signal. When the output of the gate driving signal stops, the power conversion device 2 stops its operation. On the other hand, if the controller 6 does not operate normally, the controller 6 cannot stop outputting the gate driving signal even if an overcurrent flows. Since the gate driving signal is not shut off, an overcurrent further flows, and as a result, the output of the current detection device 4 exceeds the current threshold value that is input to the comparison device 8. When the output of the current detection device 4 exceeds the current threshold value input to the comparison device 8, a shut-off control signal is output and the gate driving signal is shut-off by the shut-off device 7. When the gate driving signal is shut off by the shut-off device 7, the power conversion device 2 stops its operation.

The actions and effects of Embodiment 5 will be described below. According to Embodiment 5, when the controller 6 operates normally; the gate driving signal stop operation by the controller 6 is performed earlier than the gate driving signal shut-off operation by the shut-off device 7. As a result, when the controller 6 operates normally, the period of time during which the output of the gate driving signal stops, which is the time during which the output of the signal stops in the event of generation of an overcurrent, can be set to an arbitrary time according to a preset value set by the software. Therefore, a restart interval can be adjusted according to the system in which the electric motor control device 1 is installed. Even when the controller 6 does not operate normally, the gate driving signal can be shut-off by the shut-off device 7 for a certain period of time. In Embodiment 5, the gate driving signal shut-off operation by the shut-off device 7 is used as a preliminary protective operation in preparation for a case where the controller 6 is not no longer able to operate normally, thereby improving both reliability in safety and convenience in use.

Embodiment 6

The electric motor control device 1 according to Embodiment 6 differs from the electric motor control device 1 according to Embodiment 1 in methods for releasing the latch state in the latch device 9. In Embodiment 6, the same symbols are used for the same components as those described in Embodiment 1, and a detailed description thereof is omitted.

FIG. 14 is a block diagram illustrating an exemplary configuration of the electric motor system in which the electric motor control device 1 according to Embodiment 6 is mainly shown. The configuration of the electric motor control device 1 according to Embodiment 6 will be described below. In Embodiment 6, points that differ from Embodiment 1 will be explained. Compared to the electric motor control device 1 according to Embodiment 1, the electric motor control device 1 according to Embodiment 6 has a temperature detection device 36. Further, instead of the delay device 10, it has a temperature determination device 37. Therefore, in Embodiment 6, the output of the temperature determination device 37 is a latch release signal for the latch device 9.

The temperature detection device 36 detects the temperature of the windings of the electric motor 3 to be protected against a temperature rise due to the power supply. The temperature detection device 36 outputs a detected temperature as a detected temperature value. The temperature detection device 36 is, for example, a thermistor. Here, the temperature detected by the temperature detection device 36 is not limited to the temperature of the windings of the electric motor 3. The temperature detection device 36 may, for example, detect the temperature of a wiring connecting the power conversion device 2 and the electric motor 3. The parts of the electric motor 3 as the object for power supply are objects to be protected, but the objects to be protected may be different, FIG. 16 is a table illustrating one example of the configuration of the temperature determination device 37. FIG. 16 also illustrates one example of the logic of the temperature determination device 37. FIG. 16 shows the truth table for the temperature determination device 37. The output of the temperature determination device 37 turns to be high when the latch device 9 is in a latched state and the detected temperature value, which is the output of the temperature detection device 36, is less than the temperature threshold value according to the preset set temperature. In other words, when the output of the latch device 9 turns to be high and the output of the temperature detection device 36 is less than the temperature threshold value, the output of the temperature determination device 37 turns to be high. From FIG. 15, it is understood that the temperature determination device includes an AND gate 39 and a comparator 38.

The temperature threshold value is set to a temperature sufficiently smaller than the standard value of the temperature of the windings of the electric motor 3. The temperature threshold value is obtained, for example, by subtracting a value obtained by adding a margin to the maximum value of the temperature rise of the windings due to a single flow of an overcurrent from a standard value of the temperature of the windings of the electric motor 3.

FIG. 17 is a time chart illustrating changes in signal in association with a gate shut-off operation when an overcurrent is generated in the electric motor control device 1 according to Embodiment 6. Next, the operation of the electric motor control device 1 according to Embodiment 6 will be explained.

Until the output of the shut-off device 7 is in a high impedance state, current continues to flow through the electric motor 3, causing the temperature of the windings of the electric motor 3 to rise (A5 in FIG. 17). Since the temperature of the windings is higher than the temperature threshold value, the output of the temperature determination device 37 turns to be low (B5 in FIG. 17). When the output of the latch device 9 switches from low to high, the output of the shut-off device 7 is in a high impedance state and current does not flow to the electric motor 3, which causes the temperature of the windings to drop (C5 in FIG. 17). When the temperature of the windings becomes lower than the temperature threshold value, the output of the temperature determination device 37 switches from low to high (D5 in FIG. 17). When the output of the temperature determination device 37, which is used as the latch release signal for the latch device 9, turns to be high, the output of the latch device 9 switches to low (E5 in FIG. 17). When the output of the latch device 9 turns to be low, the output of the temperature determination device 37 switches from high to low (F5 in FIG. 17). When the output of the latch device 9 turns to be low, the output of the shut-off device 7 is no longer in a high impedance state, whereby the output of the shut-off device 7 turns to be low or high, depending on the gate driving signal (G in FIG. 17), The output of the shut-off device 7 is no longer in a high impedance state, and the power conversion device 2 operates (H5 in FIG. 17).

The actions and effects of Embodiment 6 will be described below. According to the electric motor control device 1 of Embodiment 6, if the temperature of parts to be protected, such as the electric motor 3, is higher than the preset value, the gate driving signal can be maintained in the shut-off state. This allows proper cooling of the parts to be protected and prevents excessive heat generation of the parts to be protected, even when the controller 6 does not stop outputting a gate driving signal after an overcurrent has generated and the overcurrent repeatedly flows at regular time intervals. In addition, the electric motor control device 1 of Embodiment 6 can perform a series of operations related to gate shut-off by means of a hardware configuration without using software. Therefore, it is not considered that software-mediated protection is conducted under the functional safety standard. Therefore, software standard compliance is not required to be satisfied.

Embodiment 7

The electric motor control device 1 of Embodiment 7 differs from the electric motor control device 1 of Embodiment 1 in that it judges abnormalities based on temperature. In Embodiment 7, the same symbols are used for the same components as those described in Embodiment 1.

FIG. 18 is a block diagram illustrating an exemplary configuration of an electric motor system in which the electric motor control device 1 according to Embodiment 7 is mainly shown. The configuration of the electric motor control device 1 of Embodiment 7 will be described below. In Embodiment 7, the differences from Embodiment 1 will be explained. The electric motor control device 1 of Embodiment 7 has the power conversion device 2, the controller 6, the temperature detection device 36, a temperature comparison device 40, and the shut-off device 7. The power conversion device 2, the controller 6, and the shut-off device 7 operate in the same manner as described in Embodiment 1. In FIG. 18, the temperature detection device 36 detects the temperature of the windings of the electric motor 3 to be protected, as in Embodiment 6, and outputs the detected temperature as a detected temperature value. However, the temperature detected by the temperature detection device 36 is not limited to the temperature of the windings of the electric motor 3. The parts of the electric motors 3 subject to power supply are objects to be protected, but the objects to be protected may be different. In Embodiment 7, the output of the temperature comparison device 40 serves as a shut-off control signal of the shut-off device 7.

FIG. 19 is a diagram illustrating an exemplary configuration of the temperature comparison device 40. The temperature comparison device 40 shown in FIG. 19 includes a comparator 41, a resistor 42, a resistor 43, and a resistor 44. The temperature comparison device 40 is a device with hysteresis characteristics, and the temperature comparison device 40 compares the temperature threshold value with the temperature value detected by the temperature detection device 36. In Embodiment 7, the output of temperature comparison device 40 serves as the shut-off control signal for the shut-off device 7.

FIG. 20 includes diagrams each illustrating one example of input-output characteristics of the temperature comparison device 40. The upper and lower temperature threshold values are determined according to the temperature threshold values input to the temperature comparison device 40. When the temperature to be compared to the temperature threshold value increases, the temperature comparison device 40 switches its output to low to high when the temperature to be compared is greater than the higher temperature threshold value. When the temperature to be compared falls, the temperature comparison device 40 switches the output to high to low when the temperature to be compared becomes lower than the lower temperature threshold value.

The higher temperature threshold value is a temperature lower than the standard value of the temperature of the windings of the electric motor 3. The higher temperature threshold value is a temperature which is lower by 10 degrees C. than the standard value of the temperature of the windings of the electric motor 3, for example. The lower temperature threshold value is a temperature which is lower than the higher temperature threshold value. The lower temperature threshold value is, for example, is a temperature which is lower by 10 degrees C. than the higher temperature threshold value, for example.

FIG. 21 is a time chart illustrating changes in signal in association with a gate shut-off operation when an overcurrent is generated in the electric motor control device 1 according to Embodiment 7. Next, operation of the electric motor control device 1 according to Embodiment 7 will be explained.

If the temperature of the windings of the electric motor 3 rises due to generation of an overcurrent or other events, and the temperature of the windings detected by the temperature detection device 36 becomes higher than the higher temperature threshold value, the output of the temperature comparison device 40 turns to be high (A6 in FIG. 20). When the output of the temperature comparison device 40, which is used as the shut-off control signal for the shut-off device 7, turns to be high, the output of the shut-off device 7 is in a high impedance state (B6 in FIG. 20). When the output of the shut-off device 7 is in a high impedance state, the power conversion device 2 stops (C6 in FIG. 20). When the output of the shut-off device 7 is in a high impedance state, the temperature of the windings falls because no current flows to the electric motor 3 (D6 in FIG. 20). Then, when the winding temperature becomes lower than the lower temperature threshold value, the output of the temperature comparison device 40 switches from high to low (E6 in FIG. 20). When the output of the temperature comparison device 40 turns to be low, the output of the shut-off device 7 is no longer in a high impedance state, and hence the output of the shut-off device 7 turns to be low or high, depending on the gate driving signal (F6 in FIG. 20).

When the output of the shut-off device 7 is no longer in a high impedance state, the power conversion device 2 starts operating (G6 in FIG. 20).

The actions and effects of Embodiment 7 will be explained. According to the electric motor control device 1 of Embodiment 7, the gate driving signal is shut off when the temperature of parts to be protected, such as the electric motor 3, becomes higher than the higher temperature threshold value. The gate driving signal can then be kept shut off until the temperature of parts to be protected, such as the electric motor 3, is lower than the lower temperature threshold value. This allows the gate driving signal to be shut off before the temperature of objects to be protected becomes higher than the standard value, thereby preventing the temperature of the parts to be protected from becoming higher than the standard value. Even when the controller 6 does not stop outputting the gate driving signal after an overcurrent is generated and the overcurrent flows repeatedly at regular time intervals, parts to be protected can be cooled appropriately, preventing excessive heat generation in the protected parts. Furthermore, since the comparison device 40 has the hysteresis characteristics, the temperature comparison device 40 performs latch start and latch release operations. This allows the circuit configuration to be relatively simplified and the number of components to be reduced. The electric motor control device 1 of Embodiment 7 can perform a series of operations related to gate shut-off in hardware without using software. Therefore, it is not considered that software-mediated protection is conducted under the functional safety standards. Therefore, software standard compliance is not required.

Embodiment 8

The above-mentioned advantageous effects can be obtained by combining configurations in any of two or more embodiments among Embodiments 1 to 7 mentioned above.

REFERENCE SIGNS LIST

1: electric motor control device, 2: power conversion device, 2a: power module, 3: electric motor, 4: current detection device, 4a: current detector, 5: power source, 6: controller, 7: shut-off device, 7a, 7b: control terminal, 8: comparison device, 9: latch device, 10: delay device, 11, 12, 13, 14: resistor, 15: capacitor, 16: N-channel MOSFET, 17: P-channel MOSFET, 18: comparator, 19: current detection device, 20: shut-off device, 21: comparison device, 22: latch device, 23: delay device, 24: latch device, 25: flip-flop, 26, 27: NOT gate, 28, 29: comparator, 30: N-channel MOSFET, 31: capacitor, 32, 33, 34, 35: resistor, 36: temperature detection device, 37: temperature determination device, 38: comparator, 39: AND gate, 40: temperature comparison device, 41: comparator, 42, 43, 44: resistor, 50: timer IC device

The invention claimed is:

1. A power supply control device comprising:
a power conversion device configured to perform power conversion to supply power to an object for power supply;
a controller configured to control an operation of the power conversion device;
a current detection device configured to detect a current flowing through the object for power supply;
a comparison device configured to output a shut-off start signal of which a logic of output is inverted when a value of current detected by the current detection device is larger than a preset current threshold value;
a shut-off device configured to shut off, based on a shut-off control signal, a conversion operation signal output by the controller to the power conversion device;
a latch device configured to output the shut-off control signal based on the shut-off start signal output by the comparison device and to perform, until a latch release signal is input, a latch operation, in which the shut-off device is caused to maintain a state in which a conversion operation signal is shut off; and
a delay device configured to output a latch release signal after a delay time elapses since the latch device starts a latch operation, the delay time being determined by components of the delay device,
wherein the controller, when it is configured to judge that an abnormality occurs in at least one of the object for power supply and the power conversion device, is configured to stop outputting the conversion operation signal for a period of time during which output of a signal stops, and
the period of time during which the output of the signal stops is a time set by software executed by the controller, and is a time that is equal to or longer than a time from a point when the latch device starts the latch operation to a point when the latch release signal is output.

2. The power supply control device of claim 1, wherein the latch device is configured to perform the latch operation by using, as input signals, a signal output by the comparison device and a signal output by the delay device.

3. The power supply control device of claim 2, comprising a plurality of combinations of the current detection device, the comparison device, the latch device, the delay device and the shut-off device, wherein,
in at least one of the combinations, the shut-off device shuts off the conversion operation signal when the value of current detected by the current detection device is larger than the preset current threshold value.

4. The power supply control device of claim 1, comprising a plurality of combinations of the current detection device, the comparison device, the latch device, the delay device and the shut-off device, wherein,
in at least one of the combinations, the shut-off device shuts off the conversion operation signal when the value of current detected by the current detection device is larger than the preset current threshold value.

5. The power supply control device of claim 1, wherein the controller is configured to stop output of the conversion operation signal when the controller is configured to judge that the detected current value is smaller than the preset current threshold value and is larger than software current threshold values set by the software.

6. The power supply control device of claim 5, wherein the latch device performs the latch operation by using, as input signals, a signal output by the comparison device and a signal output by the delay device.

7. The power supply control device of claim 5, comprising a plurality of combinations of the current detection device, the comparison device, the latch device, the delay device and the shut-off device, wherein,
in at least one of the combinations, the shut-off device shuts off the conversion operation signal when the value of current detected by the current detection device is larger than the preset current threshold value.

8. The power supply control device of claim 1, wherein the delay time is a time determined by a resistance value of a resistor of the delay device and a capacitance of a capacitor.

9. The power supply control device of claim 1, wherein the latch device is a timer IC device.

10. The power supply control device of claim 1, wherein the controller is configured to stop outputting the conversion operation signal based on the shut-off start signal.

11. The power supply control device of claim 1, wherein the power conversion device is configured to convert direct voltage to alternating voltage and supply alternating power to the object for power supply.

12. A power supply control device comprising:
- a power conversion device configured to perform power conversion to supply power to an object for power supply;
- a controller configured to control an operation of the power conversion device;
- a current detection device configured to detect a current flowing through the object for power supply;
- a comparison device configured to output a shut-off start signal of which a logic of output is inverted when a value of current detected by the current detection device is larger than a preset current threshold value;
- a shut-off device configured to shut off, based on a shut-off control signal, a conversion operation signal output by the controller to the power conversion device;
- a latch device configured to output the shut-off control signal based on the shut-off start signal output by the comparison device and to perform, until a latch release signal is input, a latch operation, in which the shut-off device is caused to maintain a state in which a conversion operation signal is shut off; and
- a delay device configured to output a latch release signal after a delay time elapses since the latch device starts a latch operation, the delay time being determined by components of the delay device,
- wherein the delay time is set to a time during which a temperature of an object to be protected from a rise in temperature by power supply is decreased to a preset temperature.

13. The power supply control device of claim 12, wherein the latch device performs the latch operation by using, as input signals, a signal output by the comparison device and a signal output by the delay device.

14. The power supply control device of claim 12, comprising a plurality of combinations of the current detection device, the comparison device, the latch device, the delay device and the shut-off device, wherein,
in at least one of the combinations, the shut-off device shuts off the conversion operation signal when the value of current detected by the current detection device is larger than the preset current threshold value.

* * * * *